United States Patent [19]

Matsuoka et al.

[11] Patent Number: 5,773,344
[45] Date of Patent: Jun. 30, 1998

[54] SEMICONDUCTOR DEVICE HAVING GATE ELECTRODE AND IMPURITY DIFFUSION LAYER DIFFERENT IN CONDUCTIVITY TYPE AND METHOD OF MANUFACTURING SAME

[75] Inventors: Fumitomo Matsuoka, Kawasaki; Yukari Unno, Yokohama, both of Japan

[73] Assignee: Kabushiki Kaisha Toshiba, Tokyo, Japan

[21] Appl. No.: 646,993

[22] Filed: May 9, 1996

Related U.S. Application Data

[62] Division of Ser. No. 425,239, Apr. 18, 1995, Pat. No. 5,521,416, which is a continuation of Ser. No. 141,197, Oct. 21, 1993, abandoned.

[30] Foreign Application Priority Data

Oct. 22, 1992 [JP] Japan .................................. 4-284702

[51] Int. Cl.⁶ ...................... H01L 21/336; H01L 21/4763
[52] U.S. Cl. ........................................ 438/281; 438/618
[58] Field of Search ............................. 437/27, 29, 31, 437/41, 200; 438/281, 618

[56] References Cited

U.S. PATENT DOCUMENTS

| | | | |
|---|---|---|---|
| 4,621,276 | 11/1986 | Malhi ........................................ | 257/66 |
| 4,788,160 | 11/1988 | Havemann et al. .................... | 437/200 |
| 4,816,423 | 3/1989 | Havemann ................................ | 437/31 |
| 4,978,626 | 12/1990 | Poon et al. .............................. | 437/29 |
| 5,023,191 | 6/1991 | Sakurai ..................................... | 437/27 |
| 5,116,774 | 5/1992 | Huang et al. ............................. | 437/29 |
| 5,118,638 | 6/1992 | Fujihira .................................... | 437/41 |

FOREIGN PATENT DOCUMENTS

| | | | |
|---|---|---|---|
| 0096734 | 12/1983 | European Pat. Off. ............... | 257/384 |
| 61-16566 | 1/1986 | Japan ..................................... | 257/903 |
| 63-287052 | 11/1988 | Japan ..................................... | 257/384 |
| 63-313855 | 12/1988 | Japan ..................................... | 257/384 |
| 1281755 | 11/1989 | Japan ..................................... | 257/382 |

OTHER PUBLICATIONS

Wolf et al, Silicon Processing For the VLSI Era vol. 1: Process Technology, Lattice Press, pp. 282 and 325–327, 1986.

*Primary Examiner*—John Niebling
*Assistant Examiner*—Michael S. Lebentritt
*Attorney, Agent, or Firm*—Loeb & Loeb LLP

[57] ABSTRACT

A polycrystalline silicon layer is formed on an N-type silicon substrate via an oxide film. A contact hole is formed on the polycrystalline silicon layer by applying a photoresist mask and further by patterning a predetermined contact portion between a polycide gate and a diffusion layer. Thereafter, a $P^+$ diffusion layer is formed by ion implantation with the use of the same photoresist mask. Further, a tungsten silicide layer is deposited all over the substrate. Or else, after the contact hole has been formed, the tungsten silicide layer is deposited, and then the $P^+$ diffusion layer is formed by ion implantation. Alternatively, after the contact hole has been formed, a first ion implantation is made; and after the tungsten silicide layer has been deposited, a second ion implantation is made to form the $P^+$ diffusion layer. In the manufacturing method as described above, an ohmic contact can be realized between the polycide gate electrode and the diffusion layer via the tungsten silicide layer, irrespective of the conductivity types of the gate electrode and the diffusion layer, without use of any additional metallic layer other than the polycide.

54 Claims, 3 Drawing Sheets

SEMICONDUCTOR DEVICE HAVING GATE ELECTRODE AND IMPURITY DIFFUSION LAYER DIFFERENT IN CONDUCTIVITY TYPE AND METHOD OF MANUFACTURING SAME

This is a divisional of application Ser. No. 08/425,239, filed Apr. 18 1995, now U.S. Pat. No. 5521,416, which is a continuation of application Ser. No. 08/141,197, filed Oct. 21, 1993, now abandoned.

BACKGROUND OF THE INVENTION

1. Field of the Invention

The present invention relates to a semiconductor device having a gate electrode and an impurity diffusion layer different in conductivity type from each other, and a method of manufacturing the same semiconductor device, and in particular to semiconductor devices suitably used for a CMOS cell array in a memory LSI.

2. Description of the Prior Art

In an LSI (large scale integrated circuit), it is preferable that the resistances of electrodes and wiring are as low as possible, so that metallic material is suitable as the electrode and wiring material from the practical standpoint. In the case of a MOS transistor, in particular where a metallic layer is formed on an oxide film, however, since the atoms of the metal enter the oxide film or react with the oxide film, there exists a problem in that the breakdown voltage decreases or the interface level increases. Accordingly, polycrystalline silicon has been so far used, because the resistance thereof is not so high and can be further reduced by addition of impurities thereto.

In the case of the polycrystalline silicon, however, even if any impurities are added thereto, there exists a limit of the resistance to be lowered. Accordingly, with the advance of the further microminiaturization and the higher operation speed of the MOS transistor, the above-mentioned resistances of the electrodes and the wiring have raised a new problem more and more in the field of the LSI. Therefore, finally a realization of an electrode wiring material lower in resistance than the polycrystalline silicon has been required.

For satisfying this need, recently, there has been developed a high melting point metal, which easily replaces the polycrystalline silicon because the specific resistance thereof is lower by one order of magnitude than that of the polycrystalline silicon and further the characteristics thereof are similar to those of the polycrystalline silicon. The above-mentioned high melting point metal is used as the electrode and wiring material for the CMOS transistor, in the form of a two-layer lamination structure of this metal layer (or a silicide layer containing this metal) and a polycrystalline silicon layer. In particular, a combination of the high melting point metal silicide and the polycrystalline silicon layer has been well known under the name of "polycide".

When the high melting point metal or the silicide layer is formed, upon the polycrystalline silicon layer over the oxide film it is possible to reduce the resistance of the material containing metal and further to eliminate the above-mentioned problems with respect to the metal atoms.

On the other hand, in the LSI, in particular in the case of the memory cell which is microminiaturized more and more, it is effective that the gate electrodes are used as the wiring layer as they are and additionally can be connected directly to the diffusion layer in order to improve the integration rate (density).

The conventional process of manufacturing an ohmic contact portion between the polycide gate and the diffusion layer in the SRAM (static random access memory) LSI memory cell array will be described hereinbelow with reference to FIGS. 1A to 1D.

First, as shown in FIG. 1A, a field oxide film 302 is formed on a P-type semiconductor substrate 301 in accordance with a selective oxidization method. Further, a gate oxide film 303 with a film thickness of about 150 Å is formed, and further a polycrystalline silicon layer 304 with a film thickness of about 500 to 1000 Å is deposited on the gate oxide film 303 as the gate electrode wiring material.

Secondly, as shown in FIG. 1B, a contact hole 305 is formed by removing the gate oxide film 303 and the polycrystalline silicon layer 304, on which an ohmic contact portion between the gate electrode and the diffusion layer is to be formed, in accordance with lithographic technique and etching technique. Successively, a polycrystalline silicon layer 306 with a film thickness of about 500 to 1000 Å is deposited all over the surface of the substrate 301 in the same way as with the case of the polycrystalline silicon layer 304.

Thereafter, as shown in FIG. 1C, an N-type impurity is added to the polycrystalline silicon layer 304 and the polycrystalline silicon layer 306 in accordance with P diffusion technique or ion implantation technique and annealing, and simultaneously an N-type diffusion layer 307 is formed on the surface region corresponding to the contact hole 305 of the substrate 301.

Further, as shown in FIG. 1D, a high melting point metal silicide layer 308 with a film thickness of about 1000 Å is formed on the polycrystalline silicon layer 306 by sputtering tungsten silicide. The presence of this silicide layer 308 serves to reduce the resistance of the gate wiring.

In the above-mentioned conventional process of manufacturing the semiconductor device as described above, when the ohmic contact is formed between the wiring formed by a lamination layer (composed of the impurity-added polycrystalline silicon layer 306 and the silicide layer 308) or the gate electrode of the MOSFET and the diffusion layer 307 formed on the silicon substrate 301, the conductivity type of the polycide layer 308 and the diffusion layer 307 must be the same as each other (N-type in the case of FIGS. 1C and D).

That is, in the case of the gate electrode to which an N-type impurity is added, the diffusion layer contacting the gate electrode to which the N-type impurity is added must be the same N conductivity type. In the same way, in the case of the gate electrode to which a P-type impurity is added, the diffusion layer contacting the gate electrode to which the P-type impurity is added must be the same P conductivity type.

Therefore, in a CMOS circuit of the SRAM memory cell, when the gate electrode is required to be connected to the impurity diffusion layer of different conductivity type, it has been so far necessary to use another metallic wire (e.g., Al) other than the polycide or to form the N-type region and the P-type region separately from each other by implanting ions into the polycide wiring. In the case where Al wiring is used, however, there exist problems in that the device element cannot be microminiaturized and further the number of manufacturing steps increases, thus resulting in a higher cost. In the case where two regions of different conductivity types are formed by ion implantation, however, there exists another problem in that since the conductivity type of the gate electrode is closely related to the threshold voltage of the MOSFET, the conductivity type cannot be easily determined under consideration of only the gate electrode and the diffusion layer, in addition to the problems with an increase of the number of manufacturing steps due to ion implantation and with a higher cost.

SUMMARY OF THE INVENTION

With these problems involved in the conventional semiconductor device in mind, the object of the present invention is to provide a semiconductor device and the method of manufacturing the same semiconductor device, by which an ohmic contact between the gate electrode and the impurity diffusion layer can be realized, irrespective of the conductivity types of the gate electrode and the diffusion layer, without use of any additional metallic wiring other than the polycide.

To achieve the above-mentioned object, the present invention provides a semiconductor device comprising: a silicon substrate of a first conductivity type; an impurity diffusion layer of a second conductivity type opposite to the first conductivity type, formed on a surface of said silicon substrate; a polycrystalline silicon layer of the first conductivity type, formed on said silicon substrate via an oxide film; a contact hole formed on a part of the oxide film and said polycrystalline silicon layer, passing through the surfaces of said polycrystalline silicon layer and the oxide film to a surface of said impurity diffusion layer; and an electrode wiring material layer containing metal, formed on said silicon substrate, for connecting said polycrystalline silicon layer and said silicon substrate through said contact hole.

Further, a first aspect of the present invention provides a method of manufacturing a semiconductor device, comprising the steps of: forming a polycrystalline silicon layer of a first conductivity type on a silicon substrate of the same first conductivity type via on an oxide film; forming a contact hole passing through the surfaces of the polycrystalline silicon layer and the oxide film to a surface of the silicon substrate, by removing a part of the polycrystalline silicon layer of the first conductivity type and the oxide film; forming an impurity diffusion layer of a second conductivity type opposite to the first conductivity type, by ionimplanting and diffusing an impurity of the second conductivity type to a surface region exposed through the formed contact hole on the silicon substrate and by further activating the ion-implanted and diffused layer; and forming an electrode wiring material layer containing metal, to connect the formed polycrystalline silicon layer and the formed impurity diffusion layer on the silicon substrate.

In the above-mentioned method, the diffusion layer is first formed by adding an impurity of the second conductivity type to the substrate in accordance with the ion implantation through the formed contact hole. Thereafter, the electrode wiring material layer is formed to connect the diffusion layer and the polycrystalline silicon layer.

Further, a second aspect of the present invention provides a method of manufacturing a semiconductor device, comprising the steps of: forming a polycrystalline silicon layer of a first conductivity type on a silicon substrate of the same first conductivity type on an oxide film; forming a contact hole passing through the surfaces of the polycrystalline silicon layer and the oxide film to a surface of the silicon substrate, by removing a part of the polycrystalline silicon layer of the first conductivity type and the oxide film; forming an electrode wiring material layer containing metal, to connect the formed polycrystalline silicon layer and a portion exposed through the formed contact hole on the silicon substrate; and forming an impurity diffusion layer of a second conductivity type opposite to the first conductivity type, by adding an impurity of the second conductivity type to the formed electrode wiring material layer, by diffusing the added impurity of the second conductivity type to the exposed surface region on the silicon substrate, and by further activating the impurity-added and diffused layer.

In the above-mentioned method, the contact hole is first formed. Thereafter, the impurity added to the electrode wiring material layer is diffused into the substrate to connect the diffusion layer and the polycrystalline silicon layer.

Further, a third aspect of the present invention provides a method of manufacturing a semiconductor device, comprising the steps of: forming a polycrystalline silicon layer of a first conductivity type on a silicon substrate of the same first conductivity type on an oxide film; forming a contact hole passing through the surfaces of the polycrystalline silicon layer and the oxide film to a surface of the silicon substrate, by removing a part of the polycrystalline silicon layer of the first conductivity type and the oxide film; forming an ion implantation region by ion-implanting an impurity of a second conductivity type opposite to the first conductivity type to a surface region exposed through the formed contact hole on the silicon substrate; forming an electrode wiring material layer containing metal on the silicon substrate, to connect the ion-implantation region of the impurity of the second conductivity type and the formed polycrystalline silicon layer; and forming an impurity diffusion layer of the second conductivity type, by adding an impurity of the second conductivity type to the formed electrode wiring material layer, by diffusing the added impurity of the second conductivity type to the exposed surface region on the silicon substrate, and by further activating the impurity-added and diffused layer together with the ion-implanted impurity.

In the above-mentioned method, the connection structure between the diffusion layer and the polycrystalline silicon layer can be attained in combination of the above-mentioned first and second methods.

Further, in the above-mentioned semiconductor device and the manufacturing methods, a simple high melting point metal can be used as the electrode wiring material containing metal. Alternatively, a silicide containing a high melting point metal can be used as the electrode wiring material containing metal. Further, the practical examples of the high melting point metal are tungsten, molybdenum, titanium, cobalt, tantalum, etc.

In the semiconductor device and the method of manufacturing the same semiconductor device according to the present invention, since the electric contact between the gate electrode and the impurity diffusion layer can be realized by use of the metal-containing material of polycide structure, it is possible to connect the gate electrode and the impurity diffusion layer whose conductivity types are different from each other, without use of any additional metallic wiring other than the polycide.

DETAILED DESCRIPTION OF THE PREFERRED EMBODIMENTS

A first embodiment of the method of manufacturing the semiconductor device according to the present invention will be described hereinbelow with reference to FIGS. 2A to 2E.

Figure 1A:
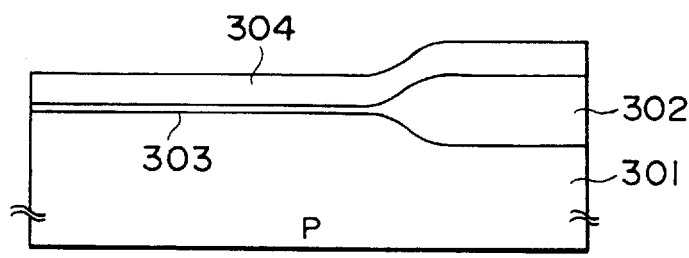
FIGS. 1A to 1D are cross-sectional views for assistance in explaining a conventional method of manufacturing the semiconductor device.
Figure 1B:
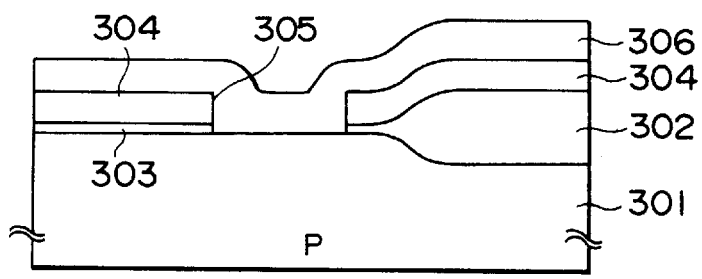
Figure 1C:
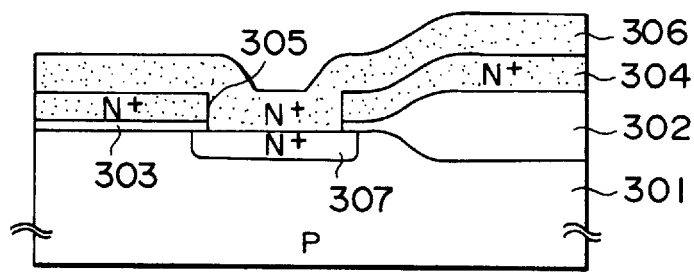
Figure 1D:
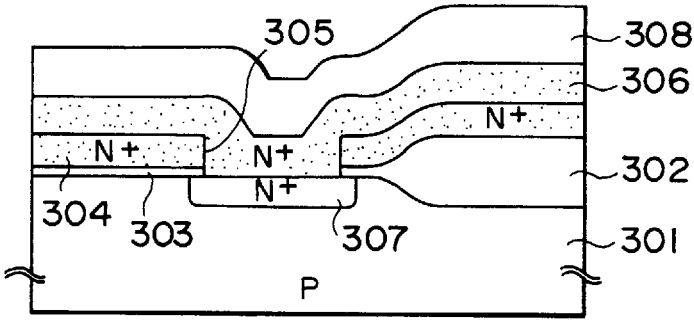
Figure 2A:
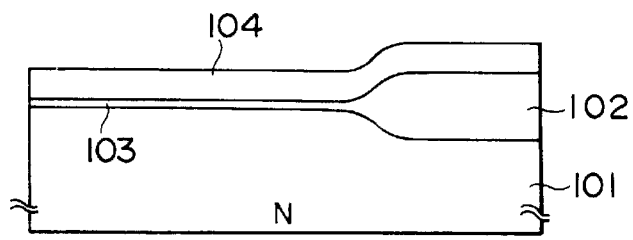
FIGS. 2A to 2E are cross-sectional views for assistance in explaining a first embodiment of the method of manufacturing the semiconductor device according to the present invention.

First, as shown in FIG. 2A, a field oxide film 102 is formed on an N-type semiconductor substrate 101 in accordance with a selective oxidization method. Further, a gate oxide film 103 with a film thickness of about 150 Å is formed within an HC-100% oxidizing atmosphere at 800° C., for instance, and further a polycrystalline silicon layer 104 with a film thickness of about 1000 Å is deposited on the gate oxide film 103 in accordance with chemical vapor deposition technique, for instance.

Figure 2B:
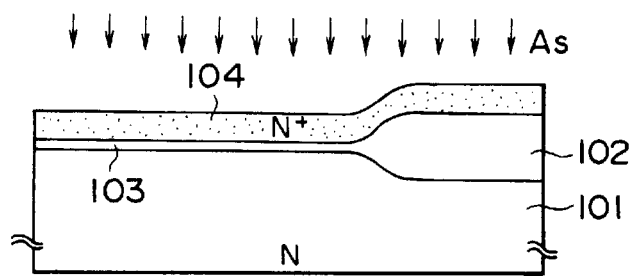

Secondly, as shown in FIG. 2B, an $N^+$ impurity is added into the poly-silicon layer 104 in accordance with a P diffusion technique (e.g., P diffusion technique at 850° C. for 30 min) or an As ion implantation technique (e.g., acceleration energy: 30 keV, dose: $5\times10^{15}$ cm$^{-2}$).

Figure 2C:
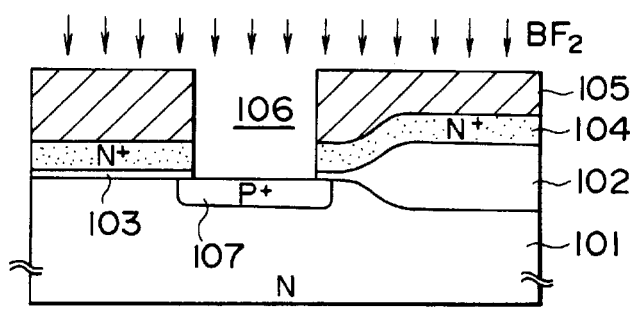

Thereafter, as shown in FIG. 2C, a photoresist mask 105 is applied onto the polycrystalline silicon layer 104 to a predetermined film thickness (e.g., 1.5 µm). Further, a predetermined ohmic contact portion (at which a gate and a diffusion layer are to be brought into contact with each other) is patterned by the lithographic technique, and further the gate oxide film 103 and the polycrystalline silicon layer 104 are both removed at only the predetermined ohmic contact portion between the gate electrode and the diffusion layer in accordance with the anisotropic etching technique and ammonium fluoride etching technique, in order to form a contact hole 106. Further, a $P^+$ diffusion layer 107 is formed by use of the same photoresist mask 105 in accordance with the ion implantation technique. In this ion implantation technique, $BF_2$ ions are implanted at the acceleration energy of 35 keV and the dose of $3\times10^{15}$ cm$^{-2}$. To protect the Si substrate from the ion implantation, it is also possible to effect the ammonium fluoride ($NH_4F$) etching, after the polycrystalline silicon has been etched by RIE (reactive ion etching) and further the ions have been implanted under the condition that the oxide film is left in place.

Figure 2D:
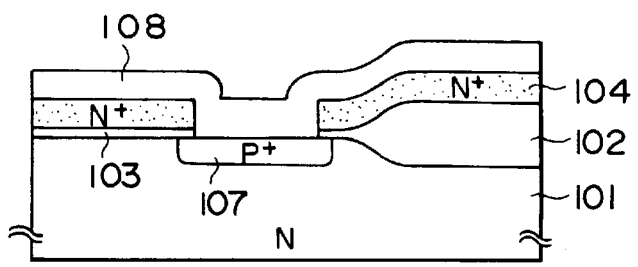

Further, as shown in FIG. 2D, a tungsten silicide layer 108 with a film thickness of about 1000 Å is deposited all over the surface thereof by the sputtering technique.

Figure 2E:
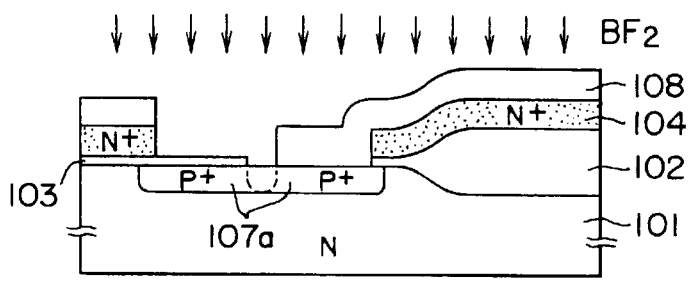

Further, as shown in FIG. 2E, the polycrystalline silicon layer 104 and the tungsten silicide layer 108 are both patterned simultaneously by use of the lithographic technique and the anisotropic etching technique in combination. And then, $BF_2$ ions are again implanted at the acceleration energy of 35 keV and the dose of $3\times10^{15}$ cm$^{-2}$ to form a $P^+$ diffusion layer 107a by using the gate electrode (the gate oxide film 103 and the polycrystalline silicon layer 104) as a mask.

As described above, in the above-mentioned first embodiment, since the ohmic contact between the gate wiring (the polycrystalline silicon layer 104) and the impurity diffusion layer 107a can be attained by intervening the metal (the tungsten silicide layer 108) of polycide structure, it is possible to enable an ohmic contact between the gate electrode 103, 104 and the impurity diffusion layer 107a whose conductivity type are different from each other, without use of any metallic wiring other than the polycide. Accordingly, even when a two-layer gate electrode including a polycrystalline silicon layer of a first conductivity type is required to be connected to an impurity diffusion layer of a second conductivity type opposite to the first conductivity type, as with the case of the CMOS circuit of the SRAM memory cell, no metallic wiring other than the two-layer wiring is required, thus contributing to a further microminiaturization of the device, markedly.

Figure 3A:
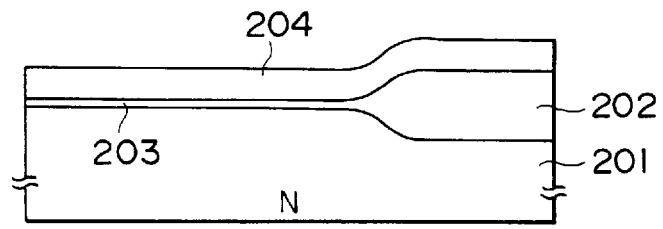
FIGS. 3A to 3F are cross-sectional views for assistance in explaining a second embodiment of the method of manufacturing the semiconductor device according to the present invention.
Figure 3B:
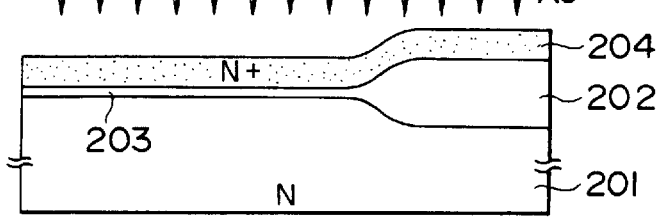

A second embodiment of the method of manufacturing the semiconductor device according to the present invention will be described hereinbelow with reference to FIGS. 3A to 3F, in which the manufacturing steps shown in FIGS. 3A and 3B are substantially the same as those shown in FIGS. 2A and 2B, respectively.

First, as shown in FIG. 3A, a field oxide film 202 is formed on an N-type semiconductor substrate 201 in accordance with the selective oxidization method. Further, a gate oxide film 203 with a film thickness of about 150 Å is formed within an HC-100% oxidizing atmosphere at 800° C., for instance, and further a polycrystalline silicon layer 204 with a film thickness of about 1000 Å is deposited on the gate oxide film 203 in accordance with the chemical vapor deposition technique, for instance.

Secondly, as shown in FIG. 3B, an $N^+$ impurity is added into the polycrystalline silicon layer 204 in accordance with the P diffusion technique (e.g., P diffusion technique at 850° C. for 30 min) or As ion implantation method (e.g., acceleration energy: 30 keV, dose: $5\times10^{15}$ cm$^{-2}$).

Figure 3C:
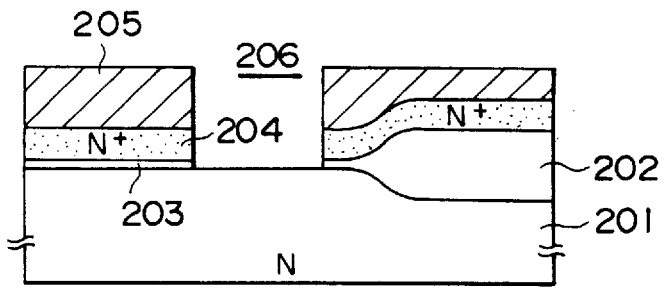
Figure 3D:
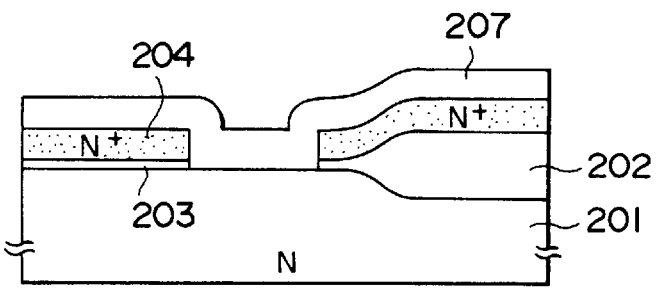

Thereafter, as shown in FIG. 3C, a photoresist mask 205 is applied onto the polycrystalline silicon layer 204 by a predetermined film thickness. Further, a predetermined ohmic contact portion (at which a gate and a diffusion layer are to be brought into contact with each other) is patterned by the lithographic method, and further the gate oxide film 203 and the polycrystalline silicon layer 204 are removed at only the predetermined ohmic contact portion between the gate electrode and the diffusion layer in accordance with the anisotropic etching technique (against the polycrystalline silicon) and the ammonium fluoride etching technique (against the gate oxide film), in order to form a contact hole 206.

Further, a tungsten silicide layer 207 with a film thickness of about 1000 Å is deposited all over the surface thereof by the sputtering technique.

Figure 3E:
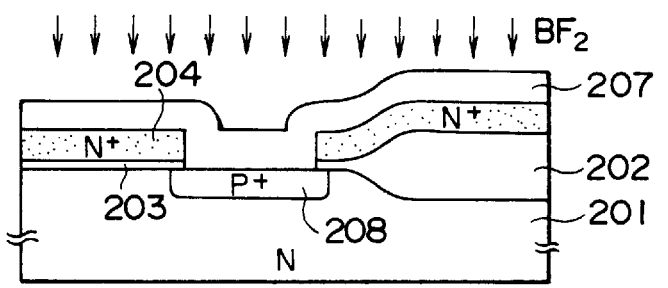

Successively, as shown in FIG. 3E, $BF_2$ ions are implanted into the tungsten silicide layer 207 at the acceleration energy of 65 keV and the dose of $5\times10^{15}$ cm$^{-2}$. Further, the impurity in the tungsten silicide 207 is diffused into the silicon semiconductor substrate by annealing at 800° C. for about 60 min to form a $P^+$ diffusion layer 208.

Figure 3F:
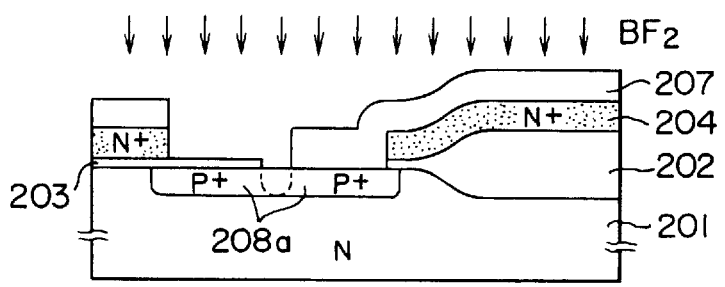

Further, as shown in FIG. 3F, $BF_2$ ions are again implanted at the acceleration energy of 35 keV and the dose of $3\times10^{15}$ cm$^{-2}$ to form a $P^+$ diffusion layer 208a by using the gate electrode (the gate oxide film 203 and the polycrystalline silicon layer 204) as a mask.

In the above-mentioned second embodiment, in the same way as with the first embodiment, since the ohmic contact between the gate wiring (the polycrystalline silicon layer 204) and the impurity diffusion layer 208a can be attained by intervening the metal (the tungsten silicide layer 207) of polycide structure, it is possible to enable an ohmic contact between the gate electrode 204 and the impurity diffusion layer 208a whose conductivity types are different from each other, without use of any metallic wiring other than the polycide.

Further, in this second embodiment, after the tungsten silicide layer 207 has been deposited, the $P^+$ diffusion layer 208 is formed in accordance with the ion implantation technique. Accordingly, there exists such an effect that the tungsten silicide layer 207 can reduce the damage caused by the ion implantation to the silicon substrate.

Further, the diffusion layer can be also formed by two different ion implantation steps, that is, the first ion implantation step (shown in FIG. 2C) into the substrate after the contact hole has been formed in the first embodiment and the second ion implantation step (shown in FIG. 3E) into the tungsten silicide layer in the second embodiment.

When the ion implantation is divided into two steps as above, it is possible to control the conditions (the acceleration energy and the dose) of each ion implantation, more freely and accurately.

Further, in the above-mentioned embodiments, tungsten silicide is used as the electrode wiring material. Without being limited thereto, however, various metals such as tungsten, molybdenum, titanium, cobalt, tantalum, etc. or other metallic silicide such as molybdenum silicide, titanium silicide, cobalt silicide, tantalum silicide, etc. can be also used.

Further, in the above-mentioned embodiments, although the gate electrode to which an N-type impurity is added is connected to the P-type diffusion layer, by way of example, it is of course possible to connect the gate electrode to which a P-type impurity is added to the N-type diffusion layer, in quite the same way as above, by changing the impurity.

As described above, in the manufacturing method of the semiconductor device according to the present invention, since the ohmic contact between the gate electrode and the impurity diffusion layer can be attained by use of the metal-containing material of polycide structure, it is possible to enable an ohmic contact between the gate electrode and the impurity diffusion layer different in conductivity type from each other, without use of any metallic wiring other than the polycide. Accordingly, even when a two-layer gate electrode including a polycrystalline silicon layer and an impurity diffusion layer (both of which are different from each other in conductivity type) are required to be connected to each other, as with the case of the CMOS circuit of the SRAM memory cell, no metallic wiring other than the two-layer wiring is required, thus promoting the microminiaturization of the semiconductor device markedly, so that the practical effect is extremely high.

What is claimed is:

1. A method of manufacturing a semiconductor device, the method comprising the steps of:

forming an oxide film on a semiconductor substrate of a first conductivity type;

forming a polycrystalline silicon layer of the first conductivity type on the oxide film;

forming a contact hole passing through the polycrystalline silicon layer and the oxide film to a surface region of the semiconductor substrate;

forming an impurity diffusion layer of a second conductivity type by ion-implanting and diffusing an impurity of the second conductivity type into the surface region of the semiconductor substrate exposed through the contact hole and by activating the ion-implanted and diffused surface region; and forming an electrode wiring layer including a high melting point metal, to form at least first and second two-layer gate electrodes, each being formed of said polycrystalline layer covered by said electrode wiring layer, each gate electrode formed on said oxide film on said semiconductor substrate, said first and second two-layer gate electrodes being separated by said contact hole, wherein the electrode wiring layer that is one of the two layers of the first and second two-layer gate electrodes is formed so that a portion of the electrode wiring layer contacts the impurity diffusion layer via said contact hole for attaining ohmic contact between said first gate electrode and the impurity diffusion layer through said contact hole.

2. The method of claim 1, wherein a high melting point metal is used as the electrode wiring layer.

3. The method of claim 1, wherein a silicide of the high melting point metal is used as the electrode wiring layer.

4. The method of claim 2, wherein the high melting point metal is selected from the group consisting of tungsten, molybdenum, titanium, cobalt and tantalum.

5. A method of manufacturing a semiconductor device, the method comprising the steps of:

forming an oxide film on a semiconductor substrate of a first conductivity type; forming a polycrystalline silicon layer of the first conductivity type on the oxide film;

forming a contact hole passing through the polycrystalline silicon layer and the oxide film to a surface region of the semiconductor substrate;

forming an electrode wiring layer including a high melting point metal, to form at least first and second two-layer gate electrodes, each being formed of said polycrystalline layer covered by said electrode wiring layer, each gate electrode formed on said oxide film on said semiconductor substrate, said first and second two-layer gate electrodes being separated by said contact hole, said electrode wiring layer contacting the surface region of the semiconductor substrate via the contact hole; and forming an impurity diffusion layer of a second conductivity type by adding an impurity of the second conductivity type to the electrode wiring layer, by diffusing the added impurity of the second conductivity type into the surface region of the semiconductor substrate, and by activating the impurity-added and diffused surface region, wherein the electrode wiring layer that is one of the two layers of the first and second two-layer gate electrodes is formed so that a portion of the electrode wiring layer contacts the impurity diffusion layer via said contact hole for attaining ohmic contact between said first gate electrode and the impurity diffusion layer through said contact hole.

6. The method of claim 5, wherein a high melting point metal is used as the electrode wiring layer.

7. The method of claim 5, wherein a silicide of the high melting point metal is used as the electrode wiring layer.

8. The method of claim 6, wherein the high melting point metal is selected from the group consisting of tungsten, molybdenum, titanium, cobalt and tantalum.

9. A method of manufacturing a semiconductor device, the method comprising the steps of:

forming an oxide film on a semiconductor substrate of a first conductivity type;

forming a polycrystalline silicon layer of the first conductivity type on the oxide film;

forming a contact hole passing through the polycrystalline silicon layer and the oxide film to a surface region of the semiconductor substrate;

forming an ion implantation region by ion-implanting an impurity of a second conductivity type into the surface region of the semiconductor substrate exposed through the contact hole;

forming an electrode wiring layer including a high melting point metal, to form at least first and second two-layer gate electrodes, each being formed of said polycrystalline layer covered by said electrode wiring layer, each gate electrode formed on said oxide film on said semiconductor substrate, said first and second two-layer gate electrodes being separated by said contact hole, said electrode wiring layer contacting the surface region of the semiconductor substrate via the contact hole; and forming an impurity diffusion layer of a second conductivity type by adding an impurity of the second conductivity type to the electrode wiring layer, by diffusing the added impurity of the second conductivity type into the surface region of the semiconductor substrate, and by activating the impurity-added and diffused surface region together with the ion-implanted impurity, wherein the electrode wiring layer that is one of the two layers of the first and second two-layer gate electrodes is formed so that a portion of the electrode wiring layer contacts the impurity diffusion layer via said contact hole for attaining ohmic contact between said first gate electrode and the impurity diffusion layer through said contact hole.

10. The method of claim 9, wherein a high melting point metal is used as the electrode wiring layer.

11. The method of claim 9, wherein a silicide of the high melting point metal is used as the electrode wiring layer.

12. The method of claim 10, wherein the high melting point metal is selected from the group consisting of tungsten, molybdenum, titanium, cobalt and tantalum.

13. The method of claim 3, wherein the high melting point metal is selected from the group consisting of tungsten, molybdenum, titanium, cobalt and tantalum.

14. The method of claim 7, wherein the high melting point metal is selected from the group consisting of tungsten, molybdenum, titanium, cobalt and tantalum.

15. The method of claim 11, wherein the high melting point metal is selected from the group consisting of tungsten, molybdenum, titanium, cobalt and tantalum.

16. A method of manufacturing a semiconductor device, the method comprising the steps of;

forming an insulating film on a substrate of a first conductivity type;

forming a silicon gate electrode layer of the first conductivity type on the insulating film;

forming a contact hole through said silicon gate electrode layer and said insulating film exposing a surface region of said substrate and forming first and second silicon gate electrodes of said first conductivity type on said insulating film, said contact hole adjacent to and between said first and second silicon gate electrodes;

forming an impurity diffusion layer of a second conductivity type through said exposed surface region of said substrate; and forming a wiring layer covering said first and second gate electrodes and at least a portion of said impurity diffusion layer, wherein said wiring layer forms an ohmic contact between said impurity diffusion layer of said second conductivity type and at least one of said first and second gate electrodes through said contact hole, said wiring layer including a high melting point metal.

17. The method of claim 16, wherein said semiconductor device is an MOS transistor.

18. The method of claimed 16, wherein said insulating film is an oxide of silicon.

19. The method of claim 16, wherein said wiring layer contacts said insulating film only along a portion of an edge of said contact hole.

20. The method of claim 16, wherein the high melting point metal is selected from the group consisting of tungsten, molybdenum, titanium, cobalt and tantalum.

21. The method of claim 16, wherein said wiring layer includes a silicide of the high melting point metal.

22. The method of claim 16, wherein the high melting point metal is selected from the group consisting of tungsten, molybdenum, titanium, cobalt and tantalum.

23. A method of manufacturing a semiconductor device, the method comprising the steps of:

forming an insulating film on a substrate of a first conductivity type;

forming a silicon gate electrode layer of the first conductivity type on the insulating film;

forming a contact hole through said silicon gate electrode layer and said insulating film exposing a surface region of said substrate and forming first and second silicon gate electrodes of said first conductivity type on said insulating film, said contact hole adjacent to and between said first and second silicon gate electrodes;

forming a wiring layer covering said first and second gate electrodes and at least a portion of said exposed surface region of said substrate; and forming an impurity diffusion layer of a second conductivity type through said wiring layer and said surface region of said substrate, wherein said wiring layer forms an ohmic contact between said impurity diffusion layer of said second conductivity type and at least one of said first and second gate electrodes through said contact hole, said wiring layer including a high melting point metal.

24. The method of claim 23, wherein said semiconductor device is an MOS transistor.

25. The method of claim 23, wherein said insulating film is an oxide of silicon.

26. The method of claim 23, wherein said wiring layer contacts said insulating film only along a portion of an edge of said contact hole.

27. The method of claim 23, wherein the high melting point metal is selected from the group consisting of tungsten, molybdenum, titanium, cobalt and tantalum.

28. The method of claim 23, wherein said wiring layer includes a silicide of the high melting point metal.

29. The method of claim 23, wherein the high melting point metal is selected from the group consisting of tungsten, molybdenum, titanium, cobalt and tantalum.

30. The method of claim 1, wherein the first conductivity type is opposite to the second conductivity type.

31. The method of claim 5, wherein the first conductivity type is opposite to the second conductivity type.

32. The method of claim 17, wherein the first conductivity type is opposite to the second conductivity type.

33. The method of claim 1, wherein the electrode wiring layer is continuous between the impurity diffusion layer and the first gate electrode.

34. The method of claim 1, wherein the electrode wiring layer by itself forms an electrical connection between the impurity diffusion layer and the first gate electrode.

35. The method of claim 1, wherein the impurity diffusion layer of the second conductivity type is the only impurity diffusion layer formed in the surface region of the semiconductor substrate that is exposed through the contact hole.

36. The method of claim 1, wherein no portion of the surface region of the semiconductor substrate that is exposed through the contact hole is formed so as to be of the first conductivity type.

37. The method of claim 5, wherein the electrode wiring layer is continuous between the impurity diffusion layer and the first gate electrode.

38. The method of claim 5, wherein the electrode wiring layer by itself forms an electrical connection between the impurity diffusion layer and the first gate electrode.

39. The method of claim 5, wherein the impurity diffusion layer of the second conductivity type is the only impurity diffusion layer formed in the surface region of the semiconductor substrate that lies below the contact hole.

40. The method of claim 5, wherein no portion of the surface region of the semiconductor substrate that lies below the contact hole is formed so as to be of the first conductivity type.

41. The method of claim 9, wherein the electrode wiring layer is continuous between the impurity diffusion layer and the first gate electrode.

42. The method of claim 9, wherein the electrode wiring layer by itself forms an electrical connection between the impurity diffusion layer and the first gate electrode.

43. The method of claim 9, wherein the impurity diffusion layer of the second conductivity type is the only impurity diffusion layer formed in the surface region of the semiconductor substrate exposed through the contact hole.

44. The method of claim 9, wherein no portion of the surface region of the semiconductor substrate exposed through the contact hole is formed so as to be of the first conductivity type.

45. The method of claim 16, wherein the wiring layer is continuous between the impurity diffusion layer and the at least one of said first and second gate electrodes.

46. The method of claim 16, wherein the wiring layer by itself forms an electrical connection between the impurity diffusion layer and the at least one of said first and second gate electrodes.

47. The method of claim 16, wherein the impurity diffusion layer of the second conductivity type is the only impurity diffusion layer formed in the surface region of the semiconductor substrate that is exposed by the contact hole.

48. The method of claim 16, wherein no portion of the surface region of the semiconductor substrate that is exposed by the contact hole is formed so as to be of the first conductivity type.

49. The method of claim 16, wherein the wiring layer is continuous between the impurity diffusion layer and the at least one of said first and second gate electrodes.

50. A method of manufacturing a semiconductor device, said method comprising the steps of:

forming an oxide film on a semiconductor substrate of a first conductivity type;

forming a polycrystalline silicon layer of the first conductivity type on the oxide film;

forming a contact hole passing through the polycrystalline silicon layer and the oxide film to a surface region of the semiconductor substrate;

forming an impurity diffusion layer of a second conductivity type by ion-implanting and diffusing an impurity of the second conductivity type into the surface region of the semiconductor substrate exposed through the contact hole and by activating the ion-implanted and diffused surface region; and forming an electrode wiring layer including a high melting point metal, to form at least one gate electrode, the gate electrode being a two-layer electrode formed of the polycrystalline layer covered by the electrode wiring layer, the gate electrode formed on the oxide film on the semiconductor substrate, wherein the electrode wiring layer that is one of the two layers of the two-layer gate electrode is formed so that a portion of the electrode wiring layer contacts the impurity diffusion layer via the contact hole for attaining ohmic contact between the gate electrode and the impurity diffusion layer through the contact hole.

51. A method of manufacturing a semiconductor device, said method comprising the steps of forming an oxide film on a semiconductor substrate of a first conductivity type;

forming a polycrystalline silicon layer of the first conductivity type on the oxide film;

forming a contact hole passing through the polycrystalline silicon layer and the oxide film to a surface region of the semiconductor substrate;

forming an electrode wiring layer including a high melting point metal, to form at least one gate electrode, the gate electrode being a two-layer electrode formed of the polycrystalline layer covered by the electrode wiring layer, the gate electrode formed on the oxide film on the semiconductor substrate, the electrode wiring layer contacting the surface region of the semiconductor substrate via the contact hole; and forming an impurity diffusion layer of a second conductivity type by adding an impurity of the second conductivity type to the electrode wiring layer, by diffusing the added impurity of the second conductivity type into the surface region of the semiconductor substrate, and by activating the impurity-added and diffused surface region, wherein the electrode wiring layer that is one of the two layers of the two-layer gate electrode is formed so that a portion of the electrode wiring layer contacts the impurity diffusion layer via the contact hole for attaining ohmic contact between the gate electrode and the impurity diffusion layer through the contact hole.

52. A method of manufacturing a semiconductor device, said method comprising the steps of forming an oxide film on a semiconductor substrate of a first conductivity type;

forming a polycrystalline silicon layer of the first conductivity type on the oxide film;

forming a contact hole passing through the polycrystalline silicon layer and the oxide film to a surface region of the semiconductor substrate;

forming an ion implantation region by ion-implanting an impurity of a second conductivity type into the surface region of the semiconductor substrate exposed through the contact hole;

forming an electrode wiring layer including a high melting point metal, to form at least one gate electrode, the gate electrode being a two-layer electrode formed of the polycrystalline layer covered by the electrode wiring layer, the gate electrode formed on the oxide film on the semiconductor substrate, the electrode wiring layer contacting the surface region of the semiconductor substrate via the contact hole; and forming an impurity diffusion layer of a second conductivity type by adding an impurity of the second conductivity type to the electrode wiring layer, by diffusing the added impurity of the second conductivity type into the surface region of the semiconductor substrate, and by activating the impurity-added and diffused surface region together with the ion-implanted impurity, wherein the electrode wiring layer that is one of the two layers of the two-layer gate electrode is formed so that a portion of the electrode wiring layer contacts the impurity diffusion layer via the contact hole for attaining ohmic contact between the gate electrode and the impurity diffusion layer through the contact hole.

53. A method of manufacturing a semiconductor device, said method comprising the steps of:

forming an insulating film on a substrate of a first conductivity type;

forming a silicon gate electrode layer of the first conductivity type on the insulating film;

forming a contact hole through the silicon gate electrode layer and the insulating film exposing a surface region of the substrate and forming at least one silicon gate electrode of the first conductivity type on the insulating film, the contact hole separating the silicon gate electrode layer into two separate portions;

forming an impurity diffusion layer of a second conductivity type through the exposed surface region of the substrate; and forming a wiring layer covering at least a portion of the gate electrode and at least a portion of the impurity diffusion layer, wherein the wiring layer forms an ohmic contact between the impurity diffusion layer of the second conductivity type and the gate electrode through the contact hole, the wiring layer including a high melting point metal.

54. A method of manufacturing a semiconductor device, said method comprising the steps of:

forming an insulating film on a substrate of a first conductivity type;

forming a silicon gate electrode layer of the first conductivity type on the insulating film;

forming a contact hole through the silicon gate electrode layer and the insulating film exposing a surface region of the substrate and forming at least one silicon gate electrode of the first conductivity type on the insulating film, the contact hole separating the silicon gate electrode layer into two separate portions;

forming a wiring layer covering at least a portion of the gate electrode and at least a portion of the exposed surface region of the substrate; and forming an impurity diffusion layer of a second conductivity type through the wiring layer and the surface region of the substrate, wherein the wiring layer forms an ohmic contact between the impurity diffusion layer of the second conductivity type and the gate electrode through the contact hole, the wiring layer including a high melting point metal.

* * * * *